United States Patent [19]
Lee

[11] Patent Number: 5,996,039
[45] Date of Patent: Nov. 30, 1999

[54] APPARATUS AND METHOD FOR IMPLEMENTING A TRI-STATE SIGNAL DRIVER

[75] Inventor: And L. Lee, San Jose, Calif.

[73] Assignee: Altera Corporation, San Jose, Calif.

[21] Appl. No.: 08/932,780

[22] Filed: Sep. 17, 1997

Related U.S. Application Data

[60] Provisional application No. 60/043,304, Apr. 11, 1997, abandoned.

[51] Int. Cl.$^6$ .................................................. G06F 13/00
[52] U.S. Cl. ......................... 710/131; 710/100; 340/825; 370/229; 370/351; 370/465
[58] Field of Search ..................................... 395/280, 311; 340/825; 370/229, 351, 465; 710/100, 131

[56] References Cited

U.S. PATENT DOCUMENTS 4,872,137 10/1989 Jennings, III ............................. 364/900
5,657,455 8/1997 Gates et al. ............................... 395/280

*Primary Examiner*—Ayaz R. Sheikh
*Assistant Examiner*—Frantz Blanchard Jean
*Attorney, Agent, or Firm*—William S. Galliani; Pennie & Edmonds LLP

[57] ABSTRACT

A tri-state signal driver circuit includes a signal driver circuit to generate a driven signal. A tri-state enable logic circuit generates a pass gate disable signal corresponding to a tri-state command signal. A demultiplexer connected to the signal driver circuit and the tri-state enable logic circuit includes a set of pass gate switches to route the driven signal to a selected output node of the demultiplexer. The set of pass gate switches are responsive to the pass gate disable signal so as to produce a tri-state output signal at the selected output node.

18 Claims, 5 Drawing Sheets

APPARATUS AND METHOD FOR IMPLEMENTING A TRI-STATE SIGNAL DRIVER

This application claims priority to the provisional application entitled "Apparatus and Method for Implementing a Tri-State Signal Driver", Ser. No. 60/043,304, filed Apr. 11, 1997 now abandoned.

BRIEF DESCRIPTION OF THE INVENTION

This invention relates generally to signal drivers used in digital circuits, such as field-programmable logic devices. More particularly, this invention relates to a tri-state signal driver implemented with an output demultiplexer.

BACKGROUND OF THE INVENTION

A signal driver is a circuit that receives an input signal and increases its power so that it can be properly processed by another circuit. Tri-state logic is digital logic in which there are three possible states, rather than the usual two states of digital off (0) or digital on (1). In tri-state logic there is a digital off (0) state, a digital on (1) state, and a high impedance state.

A tri-state signal driver is a signal driver that can operate in the three tri-state logic states. Prior art tri-state signal drivers may be implemented by modifying a conventional inverter. For example, a conventional inverter may be modified by adding a new PMOS transistor in series with an existing PMOS transistor of the inverter, and a new NMOS transistor in series with an existing NMOS transistor of the inverter. However, with this approach, to achieve the same drive strength of the original inverter, the new transistors must be relatively large. Thus, this implementation technique is relatively space-intensive.

Consequently, it would be highly desirable to provide an improved tri-state signal driver circuit. Such a device should use less die space than known tri-state signal driver circuits. Ideally, the device would use a conventional inverter and implement the tri-state operation through another circuit element associated with the tri-state signal driver circuit.

SUMMARY OF THE INVENTION

A tri-state signal driver circuit includes a signal driver circuit to generate a driven signal. A tri-state enable logic circuit generates a pass gate disable signal corresponding to a tri-state command signal. A demultiplexer connected to the signal driver circuit and the tri-state enable logic circuit includes a set of pass gate switches to route the driven signal to a selected output node of the demultiplexer. The set of pass gate switches are responsive to the pass gate disable signal so as to produce a tri-state output signal at the selected output node.

The invention establishes tri-state control by exploiting the demultiplexer pass gate switches that are already required for signal routing in the demultiplexer. The tri-state enable logic circuit only drives the demultiplexer pass gate switches, which is a relatively small load compared to using, for example, a tri-state inverter to drive an output demultiplexer. Since, the tri-state enable logic circuit does not drive a large load, it can be relatively compact. Additional area is saved if a single tri-state enable logic circuit is used for a number of signal driver circuits. In this case, the cost of the tri-state enable logic is amortized over the number of driver circuits.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
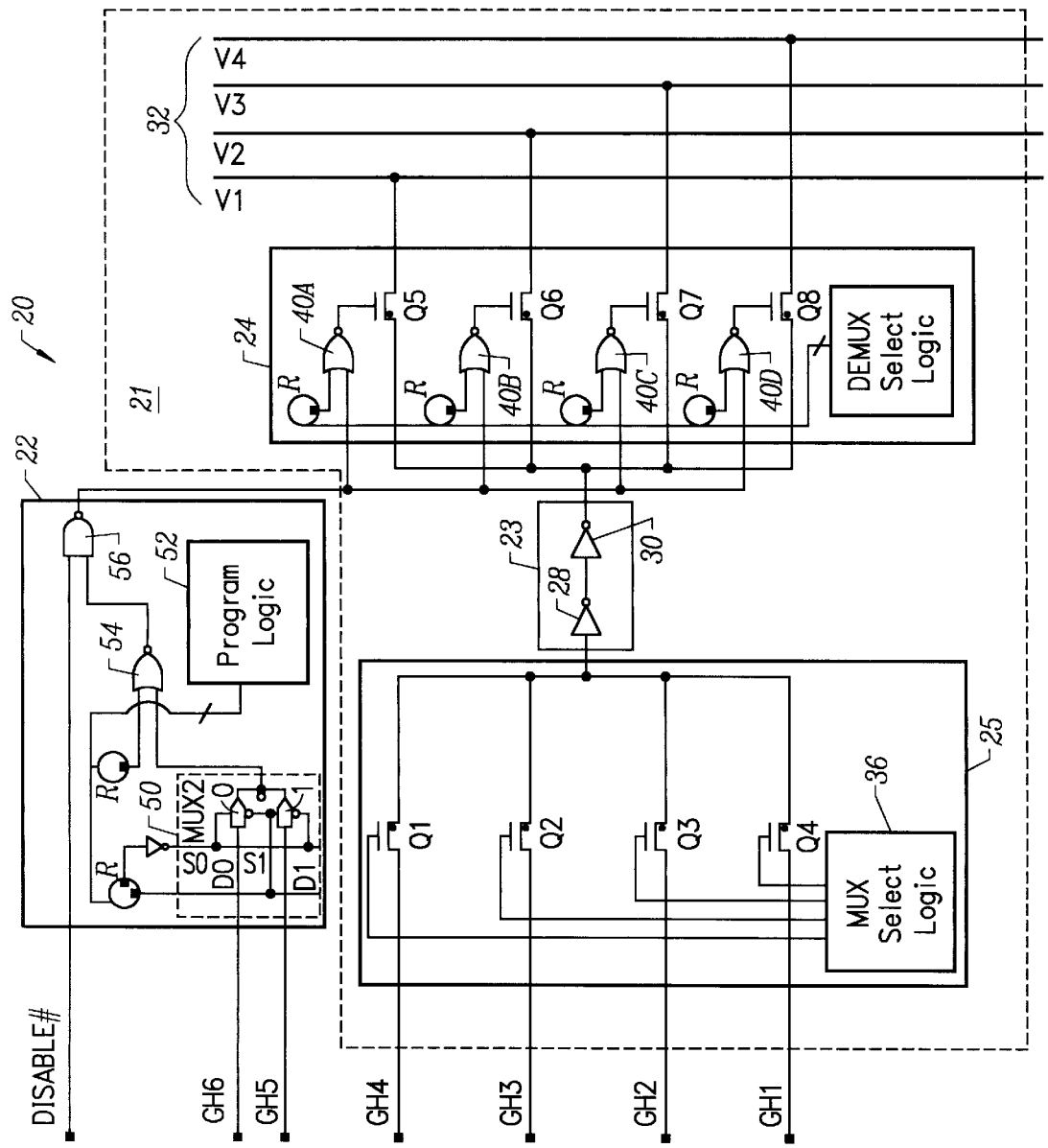
FIG. 1 is a schematic of a tri-state signal driver circuit in accordance with an embodiment of the invention.

FIG. 1 illustrates a tri-state signal driver circuit 20 in accordance with an embodiment of the invention. The tri-state signal driver circuit 20 includes a tri-state logic circuit 21 and a tri-state enable logic circuit 22.

The tri-state logic circuit 21 includes a signal driver circuit 23 to perform a signal drive function, a demultiplexer 24 to route a driven signal and to implement a tri-state operation, and, optionally, a multiplexer 25 to deliver an input signal to the signal driver circuit 23. The tri-state enable logic 22 is used to generate a pass gate disable signal used to implement the tri-state operation.

The signal driver circuit 23 may be implemented with a set of inverters 28 and 30. Other signal drive circuits may also be used in accordance with the invention. The driven signal generated by the signal driver circuit 23 is applied to the demultiplexer 24. The demultiplexer 24 routes the driven signal to a selected output line (V1, V2, V3, or V4) of a set of output lines or nodes 32. Thus, demultiplexer 24 is a 1:4 demultiplexer.

In one embodiment of the invention, a multiplexer 25 is used to pass a signal to the signal driver circuit 23. In the embodiment of FIG. 1, a multiplexer select logic circuit 36 is used to control transistors Q1, Q2, Q3, and Q4, such that a single transistor is turned on to allow a signal to be passed to the input node of the signal driver circuit 23. Thus, multiplexer 25 is a 4:1 multiplexer.

The demultiplexer 24 includes a demultiplexer select logic circuit 38. The demultiplexer select logic circuit 38 may be a conventional output selection circuit responsive to a set of input select signals. Alternately, in the case of a Programmable Logic Device, it may be may be implemented as Random Access Memory (RAM) configuration bits that are loaded when the device is turned-on. In this case, each RAM bit, as shown in FIG. 1 with an ® symbol, is used to establish a connection to a single output line. In either embodiment, the logic 38 establishes a connection between the driven signal from the signal driver circuit 23 to a selected output line. For example, the demultiplexer select logic 38 may generate demultiplexer select signals to turn-off pass gate switches Q5, Q6, and Q7, and to turn-on pass gate switch Q8. In this case, the driven signal from the signal driver circuit 23 is routed to line V4. Observe that the 4:1 multiplexer/1:4 demultiplexer configuration allows any input node (GH1, GH2, GH3, or GH4) of the multiplexer 25 to drive any output node (V1, V2, V3, or V4) of the demultiplexer 24.

Prior art demultiplexers include demultiplexer select logic 38 and pass gate switches (Q5, Q6, Q7, and Q8). Signal drive circuits in combination with demultiplexers of this type are commonplace in Programmable Logic Devices (PLDs), such as Field Programmable Gate Arrays (FPGAs), which require drivers to drive any of a number of different signals. The present invention extends the functionality of the pass gate switches so that they can be used to invoke a tri-state operation. This is done by supplying additional logic in the form of pass gate logic circuits 40 to control the output of the pass gate switches Q5–Q8. One technique for doing this is shown in FIG. 1.

FIG. 1 illustrates a tri-state enable logic circuit 22 that generates a pass gate disable signal, which is applied to each pass gate switch (Q5, Q6, Q7, and Q8). More particularly, the pass gate disable signal is routed to a set of pass gate logic circuits implemented as NOR gates 40A–40D. The pass gate logic circuits receive the pass gate disable signal and local control signals from the demultiplexer select logic circuit 38. Observe that in the embodiment of the invention of FIG. 1, if the pass gate disable signal (the output of the tri-state enable logic circuit 22) has a digital one value, then the output of each NOR gate 40A–40D will be a digital zero signal. As a result, each pass gate switch Q5, Q6, Q7, Q8 will be off and the demultiplexer 24 will not pass a driven signal from the signal driver circuit 23. In other words, the pass gate disable signal can disable the output of the demultiplexer 24 to create a tri-state condition. On the other hand, if the pass gate disable signal has a digital zero value, then the output of each NOR gate 40A–40D will be controlled by the other input value to the NOR gate, which is controlled by the demultiplexer select logic circuit 38.

The pass gate disable signal may be generated in a variety of ways. FIG. 1 illustrates that a global disable signal (disable #) may be applied to the tri-state enable logic circuit 22. If the global disable signal has a digital low value, then the output of a first logic circuit implemented as a NAND gate 56 (the pass gate disable signal) will be a digital high value, which as indicated above, disables the output of the demultiplexer 24. On the other hand, if the disable signal has a digital high value, then the output of the NAND gate 56 will be controlled by the other input to the NAND gate 56, as discussed below.

FIG. 1 illustrates input signal select logic 50 and associated program logic 52 for controlling the signal select logic 50. For example, the input signal select logic 50 may be implemented with a second logic circuit in the form of a multiplexer and the program logic 52 may be implemented as multiplexer select logic in the form of RAM bits. That is, the program logic 52 may be implemented as configuration RAM bits that are used to program the logic when the device is turned-on. Alternately, the program logic 52 may be implemented as a conventional control circuit.

FIG. 1 illustrates that user-controlled signal lines GH5 and GH6 are routed to the input signal select logic 50 and that the output from the input signal select logic 50, a first intermediate disable signal, is routed to a third logic circuit, implemented as a NOR gate 54. The NOR gate 54 also receives a control bit signal from the program logic 52; the control bit signal should be a digital zero (enable signal) so that the output of the NOR gate 54 is controlled by the output of the input signal select logic 50. If the control bit signal has a digital one value (disable signal), then user control of lines GH5 and GH6 is disabled. The output of the NOR gate 54, a second intermediate disable signal, is routed to an input node of the NAND gate 56. Observe that when the global disable signal(disable #) has a digital high value, the output of the NAND gate 56 is controlled by the output of NOR gate 54. Thus, the GH5 and GH6 input lines operate as user-controlled signal lines for implementing a tri-state operation. This user-controlled operation can be over-ridden by the global disable signal, as discussed above.

Figure 2A:
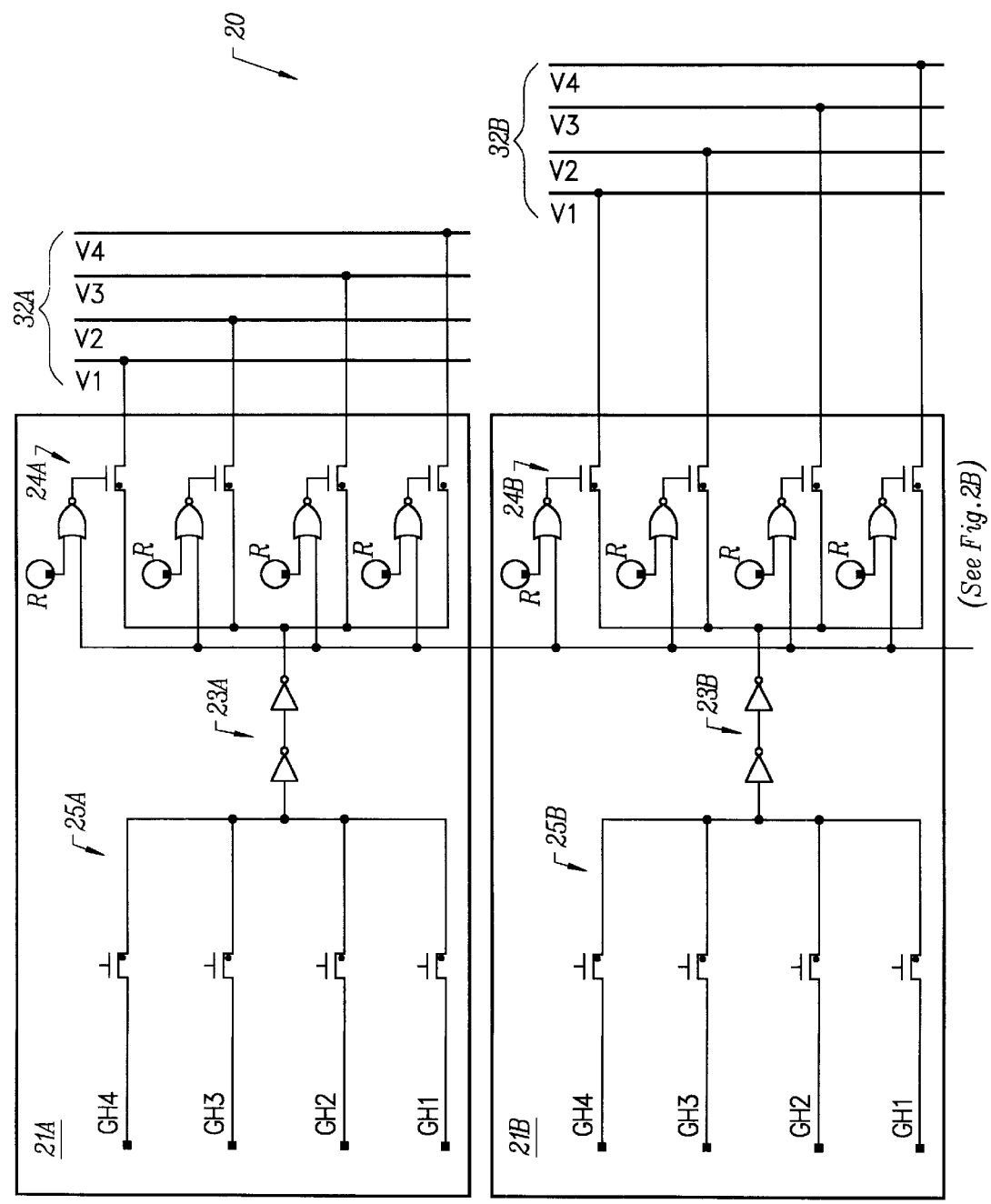
FIG. 2 is a schematic of an alternate embodiment of a tri-state signal driver circuit in accordance with an embodiment of the invention.
Figure 2B:
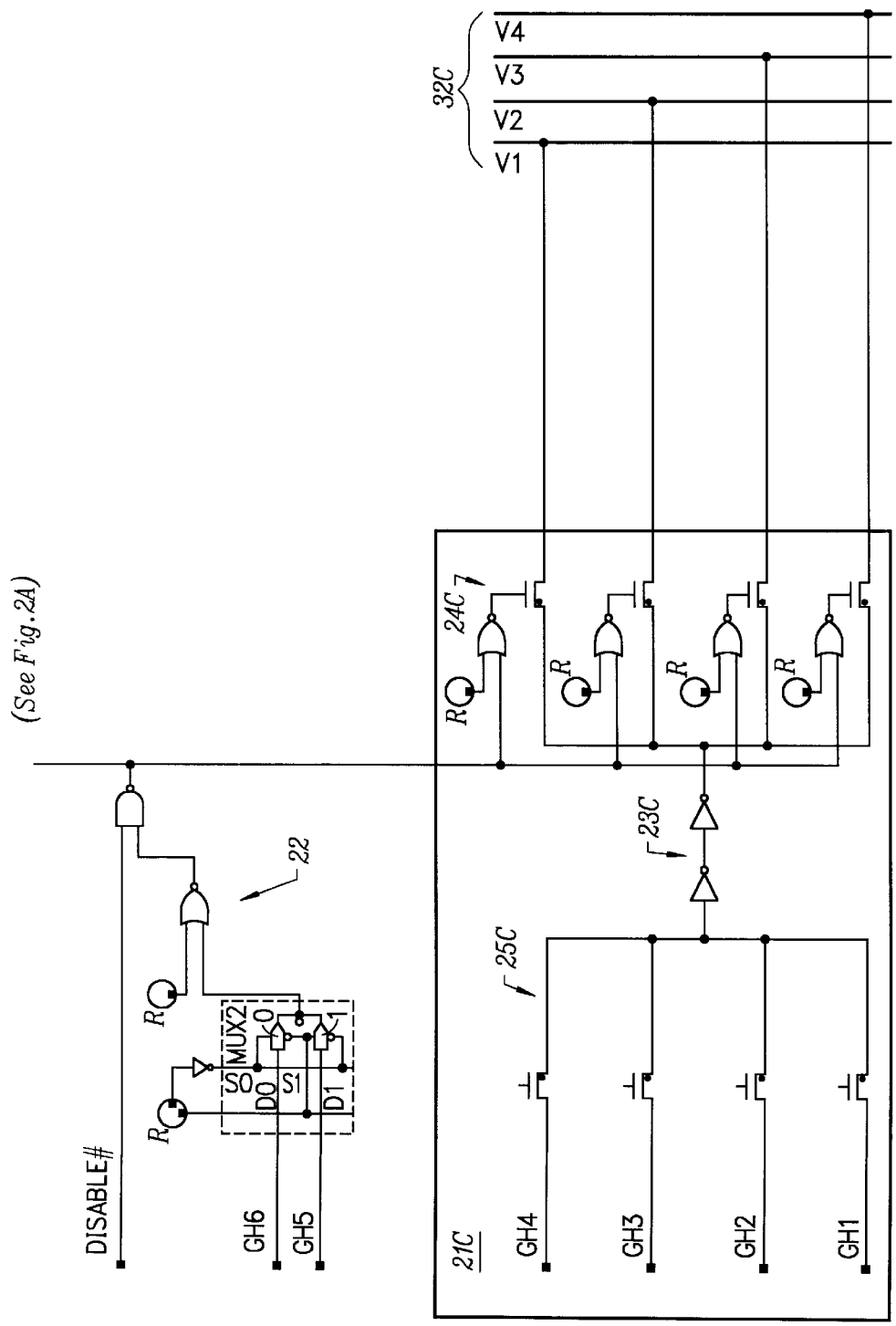

FIG. 2 illustrates an alternate embodiment of the invention wherein a single tri-state enable logic circuit 22 provides tri-state output control for a number of tri-state logic circuits 21A, 21B, and 21C. This embodiment of the invention is advantageous because the logic for the tri-state enable logic circuit 22 is amortized over a number of tri-state logic circuits 21.

Figure 3:
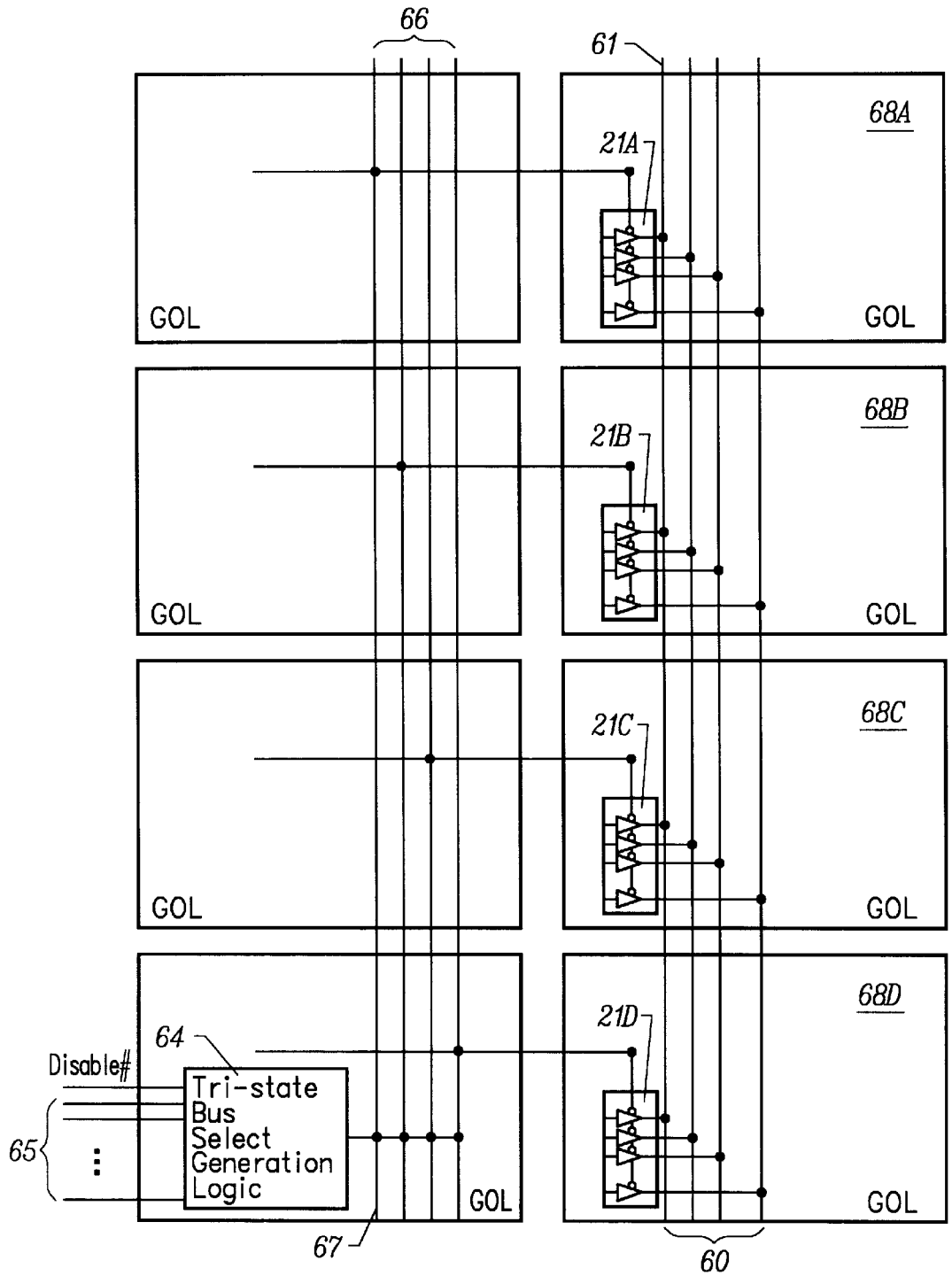
FIG. 3 is a schematic of a tri-state bus constructed using a tri-state signal driver circuit of the invention.

FIG. 3 illustrates a tri-state bus 60 constructed in accordance with the invention. In particular, the figure illustrates four tri-state logic circuits (21A, 21B, 21C, and 21D) controlling the tri-state bus 60. Observe that each tri-state logic circuit drives each line of the bus 60. For example, each tri-state logic circuit 21 drives the same vertical line 61, of the tri-state bus 60. Each tri-state logic circuit 21 receives a pass gate disable signal from the tri-state bus select generation logic 64, over control bus 66. Each line of the control bus 66 controls a single tri-state logic circuit 21. For example, line 67 controls tri-state logic circuit 21 A. The tri-state bus select generation logic 64 generally corresponds to the tri-state enable logic 22 because it receives a global disable signal, which is processed in the manner previously described to generate a pass gate disable signal. The tri-state bus select generation logic 64 also has a set of input lines for user-controlled operation of the pass gate disable signal, as described above in reference to the tri-state enable logic circuit 22. In this case, a larger multiplexer and more complex program logic is required to accommodate the additional tri-state logic circuits.

In sum, a 4:1 control bus 66 can be used to control four tri-state logic circuits 21A, 21B, 21C, and 21D, each of which includes N input nodes and N output nodes. The N input node, N output node tri-state logic circuits are shown as blocks 68A, 68B, 68C, and 68D. The tri-state bus select generation logic 64 determines the tri-state enable for each of the blocks 68A–68D, dictating which one of the blocks should be driving the tri-state bus 60 at any given time.

Figure 4:
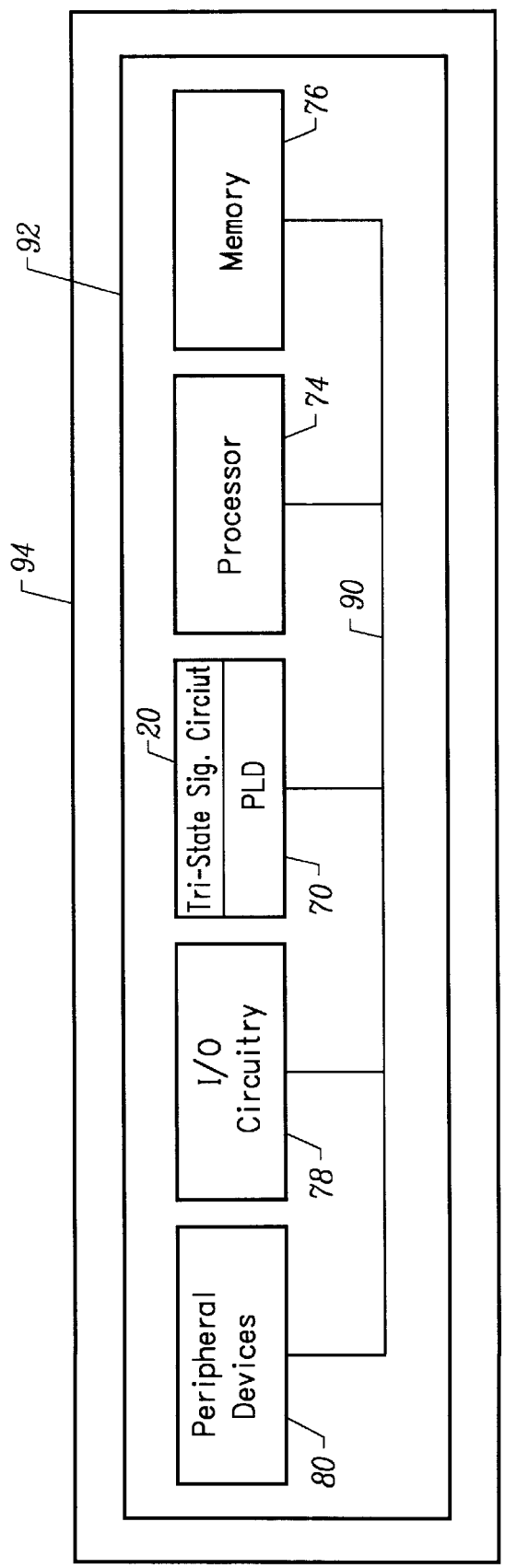
FIG. 4 illustrates a tri-state signal driver of the invention incorporated into a data processing system.

FIG. 4 illustrates a programmable logic device (PLD) 70 incorporating a tri-state signal driver circuit 20 in accordance with the invention. The PLD 70 forms a part of a data processing system 72. The data processing system 72 may include one or more of the following components: a processor 74, a memory 76, input/output circuitry 78, and peripheral devices 80. These components are coupled together by a system bus 90 and are populated on a circuit board 92, which is contained in an end-user system 94.

The system 72 can be used in a wide variety of applications, such as computer networking, data networking, instrumentation, video processing, digital signal processing, or any other application where the advantage of using reprogrammable logic is desirable. The PLD 70 can be used to perform a variety of logic functions. For example, the PLD 70 can be configured as a processor or controller that works in cooperation with processor 74. The PLD 70 may also be used as an arbiter for arbitrating access to a shared resource in the system 72. In yet another example, the PLD 70 can be configured as an interface between the processor 74 and one of the other components in the system 72.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

I claim:

1. A tri-state signal driver circuit, comprising:

a signal driver circuit to generate a driven signal;

a tri-state enable logic circuit to generate a pass gate disable signal in response to a global disable signal or user-controlled signals; and a pass circuit, implemented as a demultiplexer, connected to said signal driver circuit and said tri-state enable logic circuit, said pass circuit including a set of pass gate switches to control the outputs of a corresponding set of output nodes, said pass gate circuit routing said driven signal to a selected output node of said pass circuit, said set of pass gate switches being responsive to said pass gate disable signal so as to produce a tri-state output signal at said selected output node.

2. The apparatus of claim 1 wherein:

said signal driver circuit includes a first inverter and a second inverter.

3. The apparatus of claim 2 wherein:

said tri-state enable logic circuit includes a second logic circuit to generate a first intermediate disable signal from said user-controlled signals.

4. The apparatus of claim 3 wherein:

said tri-state enable logic circuit includes said second logic circuit implemented as a multiplexer.

5. The apparatus of claim 4 wherein:

said tri-state enable logic includes a program logic circuit to control said multiplexer.

6. The apparatus of claim 5 wherein:

said tri-state enable logic circuit includes a third logic circuit to combine the output of said multiplexer with output from said program logic circuit to produce a second intermediate disable signal.

7. The apparatus of claim 6 wherein:

said tri-state enable logic circuit uses said first logic circuit to combine said second intermediate disable signal with said global disable signal to produce said pass gate disable signal.

8. The apparatus of claim 1 wherein:

said tri-state enable logic circuit includes a first logic circuit to generate said pass gate disable signal from said global disable signal.

9. The apparatus of claim 1 further comprising:

a multiplexer connected to said signal driver circuit.

10. The apparatus of claim 1 further comprising a pass gate logic circuit connected to each of said pass gate switches to control said pass gate switches in response to said pass gate disable signal.

11. The apparatus of claim 10 further comprising a select logic circuit to generate local control signals for application to said pass gate logic circuit.

12. The apparatus of claim 1 further comprising a plurality of pass circuits connected to said tri-state enable logic circuit.

13. A data processing system, comprising:

a field programmable logic device, including a signal driver circuit to generate a driven signal;

a tri-state enable logic circuit to generate a pass gate disable signal in response to a global disable signal or user controlled signals; and a demultiplexer connected to said signal driver circuit and said tri-state enable logic circuit, said demultiplexer including a set of pass gate switches to control the output of a corresponding set of output nodes of said demultiplexer, said pass gate circuit routing said driven signal to a selected output node of said demultiplexer, said set of pass gate switches being responsive to said pass gate disable signal so as to produce a tri-state output signal at said selected output node.

14. The apparatus of claim 13 further comprising:

a system bus connected to said field programmable logic device; and a plurality of data processing elements connected to said system bus.

15. The apparatus of claim 14 wherein said plurality of data processing elements include a processor and input/output circuitry.

16. The apparatus of claim 15 wherein said plurality of data processing elements include peripheral devices and a memory.

17. The apparatus of claim 13 further comprising a multiplexer connected to said signal driver circuit.

18. The apparatus of claim 13 further comprising a plurality of demultiplexers connected to said tri-state enable logic circuit.

* * * * *

UNITED STATES PATENT AND TRADEMARK OFFICE
CERTIFICATE OF CORRECTION

PATENT NO. : 5,996,039

DATED : November 30, 1999

INVENTOR(S) : Lee

It is certified that error appears in the above-identified patent and that said Letters Patent is hereby corrected as shown below:

Section [75] Inventor:, replace "And" with --Andy--.

Signed and Sealed this

Twenty-seventh Day of June, 2000

*Attest:*

*Attesting Officer*

Q. TODD DICKINSON

*Director of Patents and Trademarks*